United States Patent
Saboungi et al.

(10) Patent No.: US 6,316,131 B1
(45) Date of Patent: Nov. 13, 2001

(54) LARGE MAGNETORESISTANCE IN NON-MAGNETIC SILVER CHALCOGENIDES AND NEW CLASS OF MAGNETORESISTIVE COMPOUNDS

(75) Inventors: Marie-Louis Saboungi; David C. L. Price; Thomas F. Rosenbaum, all of Chicago, IL (US); Rong Xu, Den Haag (NL); Anke Husmann, Kiel (DE)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 09/153,087

(22) Filed: Sep. 10, 1998

Related U.S. Application Data

(60) Provisional application No. 60/058,704, filed on Sep. 12, 1997.

(51) Int. Cl.[7] .................................................. G11B 5/66
(52) U.S. Cl. ................ 428/692; 428/694 R; 428/694 T; 428/900; 438/46; 430/19; 430/270; 430/495; 430/346
(58) Field of Search .................. 428/692, 694 R, 428/694 T, 900; 438/46; 430/19, 270, 495, 346

(56) References Cited

U.S. PATENT DOCUMENTS

| | | | |
|---|---|---|---|
| 5,215,862 | * | 6/1993 | Suzuki ................................ 430/270 |
| 6,033,929 | * | 3/2000 | Murakami ............................ 438/46 |

* cited by examiner

*Primary Examiner*—Leszek Kiliman
(74) *Attorney, Agent, or Firm*—Joy Alwan; Mark P. Dvorscak; Virginia B. Caress

(57) ABSTRACT

The heavily-doped silver chalcogenides, $Ag_{2+\delta}Se$ and $Ag_{2+\delta}Te$, show magnetoresistance effects on a scale comparable to the "colossal" magnetoresistance (CMR) compounds. Hall coefficient, magnetoconductivity, and hydrostatic pressure experiments establish that elements of narrow-gap semiconductor physics apply, but both the size of the effects at room temperature and the linear field dependence down to fields of a few Oersteds are surprising new features.

7 Claims, 5 Drawing Sheets

LARGE MAGNETORESISTANCE IN NON-MAGNETIC SILVER CHALCOGENIDES AND NEW CLASS OF MAGNETORESISTIVE COMPOUNDS

RELATED APPLICATION

This is a continuation-in-part application claiming the benefit of copending U.S. Provisional Application Ser. No. 60/058,704, filed Sep. 12, 1997.

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

FIELD OF THE INVENTION

This invention relates generally to magnetoresistive compounds and is particularly directed to a class further identified as narrow-gap, self-doping compounds.

BACKGROUND OF THE INVENTION

In recent years, new materials have emerged as potential candidates for magnetoresistive (MR) devices. In the case of "giant" magnetoresistance (GMR), interfacial spins modulate the electron transport both in artificially engineered nanostructural materials consisting of magnetic multilayers and in properly crafted granular alloys. The "colossal" magnetoresistance (CMR) analogs are manganite perovskites with a magnetic-field-driven metal-insulator transition at tens of kOe. These compounds have the general formula $A_{1-x}B_xMnO_{3+\delta}$, where A=La, Nd and B=Bu, Sr, Ca, Pb. These compounds undergo a transition into a ferromagnetic conducting state for a narrow composition range around x=0.33 where the resistivity is ~$10^4$ $\mu\Omega$-cm (comparable in magnitude with narrow-gap semiconductors). Near room temperature, the normalized MR can be very large for H of many tens of kOe, the scale of the magnetic-field-driven metal-insulator transition, but $\Delta\rho/\rho$ falls precipitously at low fields.

The silver chalcogenides, $Ag_2S$, $Ag_2Se$ and $Ag_2Te$, are classic superionic conductors of technological import as solid electrolytes. In their high temperature ($\alpha$) phase, electrical transport proceeds via a well-orchestrated coupling of microscopic lattice distortions to the ion migration dynamics. Below T~400 K, there is a structural transformation into the $\beta$ phase, where the cation sublattice freezes into a semiconducting state with characteristic energy gaps as small as a few hundredths of an eV. Magnetic fields are commonly applied during the growth process to aid anion vaporization, but have a negligible effect on the electronic response in the solid. In fact, a noise-limited magnetoresistance (MR) in intrinsic $\beta$-$Ag_2Se$ has been reported.

SUMMARY OF THE INVENTION

Here we report on a previously unexplored class of magnetoresistive compounds: the silver chalcogenides. $Ag_2S$, $Ag_2Se$, and $Ag_2Te$ are classic superionic conductors at high temperature. Below T~400 K, the cation sublattice freezes into a non-magnetic, semiconducting state with no appreciable magnetoresistance. We find that slightly altering the stoichiometry leads to a huge increase in the magnetic response. At room temperature, we observe a positive MR of up to 200% in H=55 kOe, making $Ag_{2+\delta}Se$ and $Ag_{2+\delta}Te$ highly competitive with the CMR materials. Moreover, our most responsive samples demonstrate an unusual linear dependence on H, indicating both a robust response down to fields of practical importance and a peculiarly long length scale associated with the underlying mechanism.

DETAILED DESCRIPTION OF PREFERRED EMBODIMENT

Although substantial values of the magnetoresistance are found for a variety of materials at low temperatures and in high magnetic fields, useful devices must operate at room temperature and in modest fields, i.e., H<1 kOe. For non-magnetic metals, semimetals, and semiconductors, the normalized MR,$\Delta\rho(T,H)/\rho(T,0)$, is usually negligible for such fields at T~300 K. Narrow-gap semiconductors such as PbTe and InSb do indeed have a formidable low field MR at room temperature (0.01 to 1% for H=1 kOe), but the characteristic resistivities are so large that the intrinsic device noise becomes the limiting factor. Balancing these constraints has led to permalloy ($Ni_{0.31}Fe_{0.19}$), with a saturation value $\Delta\rho/\rho$~2.5% at H~5 Oe, becoming the material of choice for standard applications. GMR compounds appear to hold the greatest promise as replacement materials in the near term, with $\Delta\rho/\rho$ as high as 40% for H$\leq$1 kOe observed in Cu/Co multilayers at room temperature. Both the high field scale and the resistivity~$10^4$ $\mu\Omega$-cm (comparable in magnitude with narrow-gap semiconductors) are present obstacles for potential CMR devices.

Silver selenide and silver telluride are narrow-gap self-doped degenerate n-type semiconductors. In their high temperature ($\alpha$) phase, electrical transport proceeds via a well-orchestrated coupling of microscopic lattice distortions to the ion migration dynamics. The structural transformation into the $\beta$ phase opens up an energy gap as small as a few hundredths of an eV. The electron density in the conduction band is determined largely by the stoichiometric index, $\delta$. We cut specimens with typical dimensions 1 to 3 mm on a side and 1 mm thick from long boules of annealed material with a designated purity of 5N. Slight gradients in stoichiometry along the length of the boule permitted the choice of samples with a range of electron densities. For both semiconductors, the nominal $\delta$ is approximately 0.01, with $\rho$(300 K)$\leq 10^3$ $\mu\Omega$-cm. We performed four-probe resistivity and five probe Hall coefficient measurements in fields up to 55 kOe using a conventional ac bridge technique in the ohmic and frequency-independent limits. The relative error in the magnetoresistivity is less than 0.01%; there is an absolute uncertainty, however, of 25% because of the finite extent of the silver epoxy contacts on mm scale samples. We applied hydrostatic pressure with a BeCu piston-anvil self-locking pressure clamp, using silicone oil as the pressure medium and a chip of $(V_{0.99}Ti_{0.01})_2O_3$ as the manometer.

Figure 1:
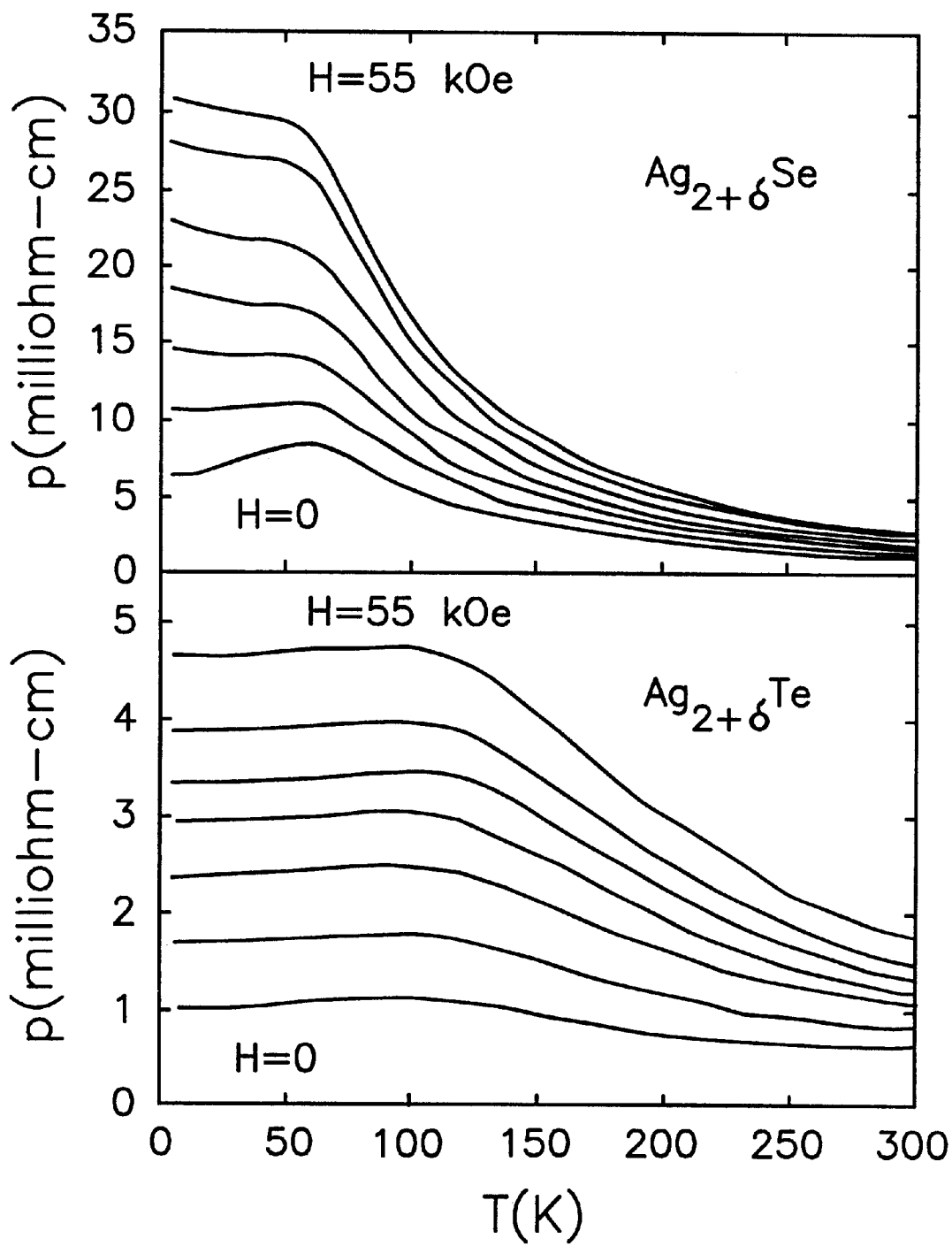
FIG. 1 shows the variation of resistivity $\rho$ as a function of temperature T at a series of magnetic fields H=0, 9, 17, 26, 36, 48, 55 kOe for $Ag_{2+\delta}Se$ and H=0, 10, 20, 29, 35, 43, 55 kOe for $Ag_{2+\delta}Te$.

We plot in FIG. 1 an overview of the temperature dependence on the resistivity of $Ag_{2+\delta}Se$ and $Ag_{2+\delta}Te$ for a series of applied magnetic fields. The field is applied perpendicularly to the current direction; measurements of the longitudinal MR also show a considerable effect, but at least a factor of 2 smaller than the transverse MR. The temperature dependence of $\rho(H=0)$ is consistent with impurity band electrons on the delocalized side of the Mott metal-insulator transition. Between T=4.2 K and 60 K ($Ag_{2+\delta}Se$) [100 K ($Ag_{2+\delta}Te$)], the resistivity rises because n is constant and the phonon scattering increases with T. At higher T, n becomes activated and $\rho$ decreases with increasing T in accordance with the usual behavior of small gap semiconductors.

Figure 2:
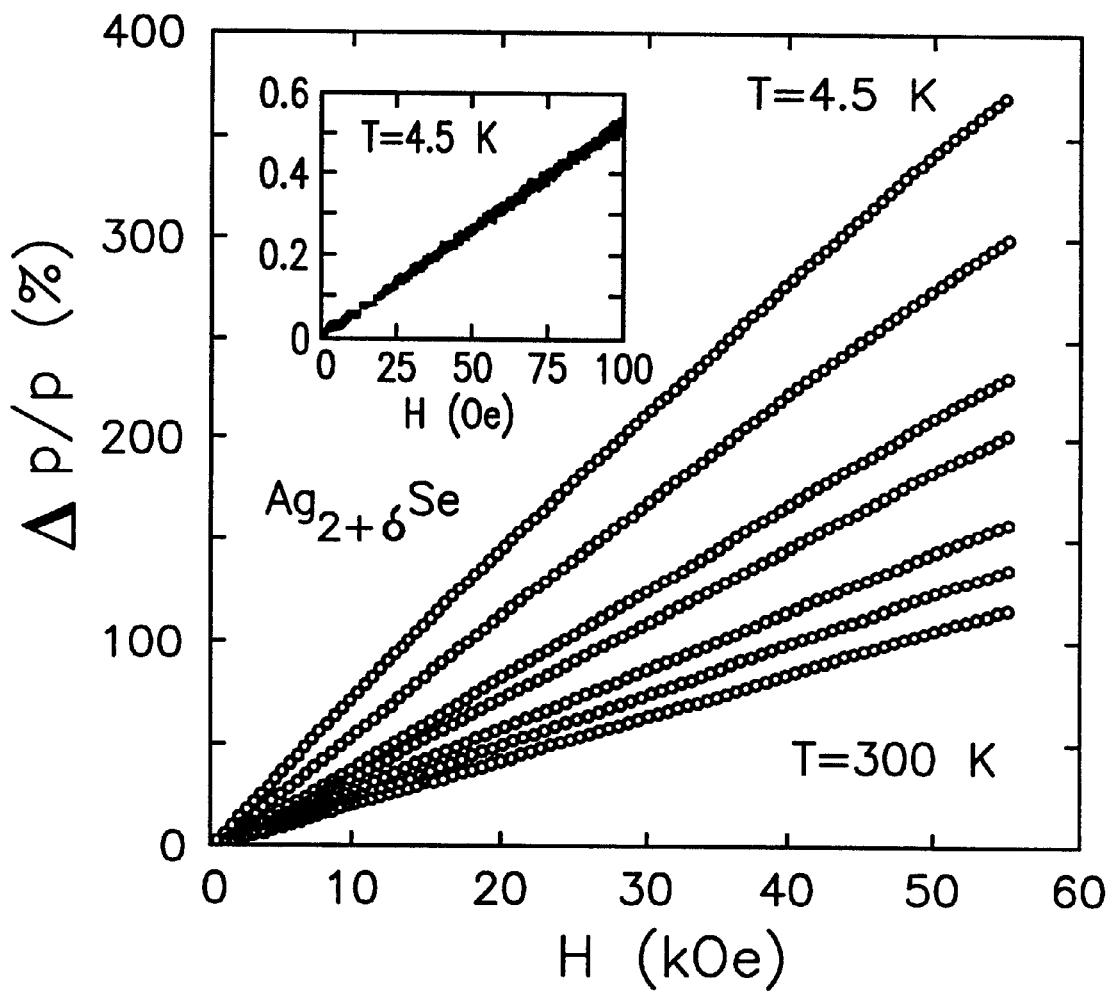
FIG. 2 illustrates normalized magnetoresistance $\Delta\rho(T,H)/\rho(T,0)$ as a function of magnetic field H at a series of temperatures T=4.5, 30, 60, 90, 180, 270, and 300 K. Inset: The linear field dependence continues down to H of a few Oe, implying a very large characteristic length scale.

The large size and the magnetic field dependence of the normalized MR can be seen explicitly in FIG. 2. There is no evidence of saturation up to at least 55 kOe over the entire temperature range. $\Delta\rho/\rho$ increases linearly with increasing H at high T, with a tendency towards a slightly sublinear dependence above tens of kOe at low T. The normal solution of the Boltzmann equation for MR yields an $H^2$ dependence, although scattering off the lattice and/or spin fluctuations can produce $\Delta\rho/\rho$ H. As can be seen in the inset to FIG. 2, the MR falls below 1% by H=100 Oe. The surprise in our data is that the pertinent field scale at which the MR crosses over from a quadratic to a linear dependence on H is so small: $H_c \sim 10$ Oe, with the exact value dependent on the range of fit. It is difficult to identify a physical length scale which corresponds to this magnetic field value. Yet, the value of $H_c$ appears to be related intimately to the large magnetoresistive response. Samples which exhibit a smaller MR also display a larger crossover field, up to two orders of magnitude higher.

Figure 3:
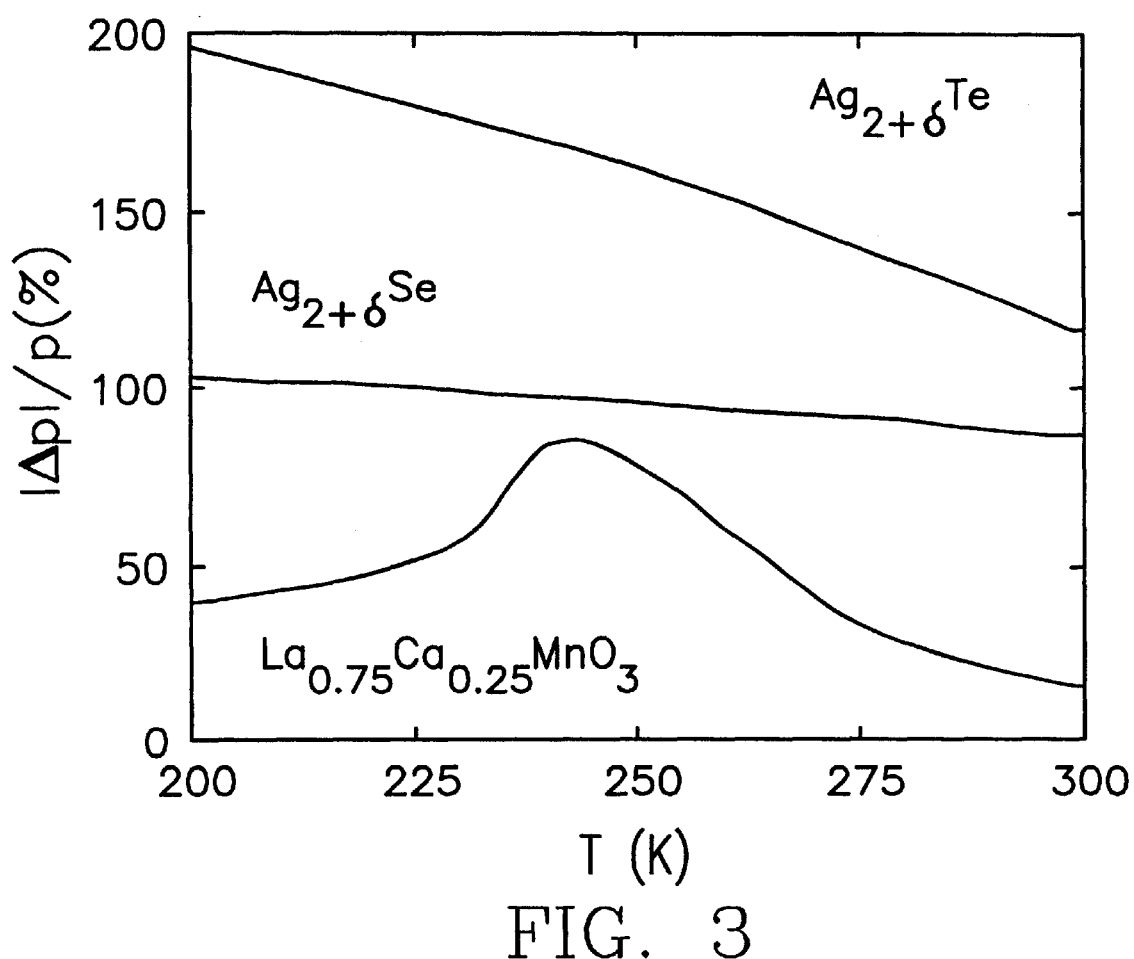
FIG. 3 is a graphic comparison of the normalized magnetoresistance of the silver chalcogenides and a representative CMR material at H=40 kOe.

We compare in FIG. 3 the high-field (40 kOe), normalized MR near room temperature for $Ag_{2+\delta}Se$, $Ag_{2+\delta}Te$, and a representative CMR compound, $La_{0.75}Ca_{0.25}MnO_3$, which exhibits a negative MR. The absolute value of the MR is pronounced for all three, but of opposite sign—positive for the silver chalcogenides and negative for the manganite perovskites—reflecting completely different physical mechanisms. This difference is exemplified as well in the contrasting temperature evolution of the MR. $\Delta\rho/\rho$ of the CMR material changes rapidly in a narrow temperature range and must either be fine tuned so that the metal-insulator transition temperature is near 300 K or modulated via interfacial tunneling in fine-grained polycrystals. By contrast, the silver chalcogenide data evolve smoothly with temperature and exhibit no sharp features.

The question remains as to how to optimize the normalized MR for $Ag_{2+\delta}Se$ and $Ag_{2+\delta}Te$. As demonstrated in FIG. 4, it appears that the carrier density n is a key variable. Analysis of the linear Hall response ($\delta 1/n$) at H=5 kOe in the single carrier "exhaustion" regime (temperatures below the maximum of $\rho(T)$ in FIG. 1, where the Hall coefficient, $R_H$, becomes temperature independent), shows an increasing MR with decreasing $R_H$ (increasing n). An increase in the intrinsic carrier density from $2.5 \times 10^{17}$ to $9 \times 10^{17}$ cm$^{-3}$ results in an increase in $\Delta\rho(T=4.5 K, H=55 kOe) / \rho(T=4.5 K, H=0)$ from 200 to 350%. Moreover, identically doped samples of $Ag_{2+\delta}Se$ and $Ag_{2+\delta}Te$ have identically large MR.

The classical, orbital MR is controlled by the ratio of the cyclotron frequency to the scattering rate, $\omega_c\tau = eH\tau/m^*c$. Doped narrow-gap semiconductors have small effective masses, $m^* \sim 0.02 m_e (0.08 m_e)$ for $Ag_2Te$ ($Ag_2Se$), which gives a large MR. Furthermore, good metallic conduction can be obtained even at low carrier densities, since the combination of a small $m^*$ and a large dielectric constant pushes the metal-insulator transition boundary to low densities. One expects a positive MR, quadratic at low fields, and saturating for $\omega_c\tau < 1$. A non-saturating, but still quadratic, MR can occur with perfect compensation along with a vanishing Hall effect, as would be expected in the intrinsic regime at high T.

Despite the advantageous standing of narrow-gap semiconductors, the classical picture seems incapable of explaining the silver chalcogenide data, even allowing for a crossover from degenerate to non-degenerate transport seen in $\rho(T>100 K)$. The MR is linear down to very low fields; it shows little sign of saturation at high fields, even though $\omega_c\tau > 5$ at the highest fields for the $Ag_{2+\delta}Te$ sample in FIG. 1; and it is only weakly temperature dependent, with no evidence for a crossover associated with degenerate to non-degenerate carriers. Inhomogeneous density fluctuations, on a scale larger than the mean free path but much smaller than the sample size, can produce a MR linear in H with $\Delta\rho/\rho = \omega_c\tau T$. The electronic and point defects which occur in the silver chalcogenides for $\delta \geq 10^{-4}$ may provide a source of such density fluctuations, leading in principle to a high-field, transverse MR of the observed size. However, this mechanism cannot explain either the anomalously low $H_c$ (at $\omega_c\tau < 1$) or the correlation between $R_H$ and $\Delta\rho/\rho$ demonstrated in FIG. 4.

Figure 4:
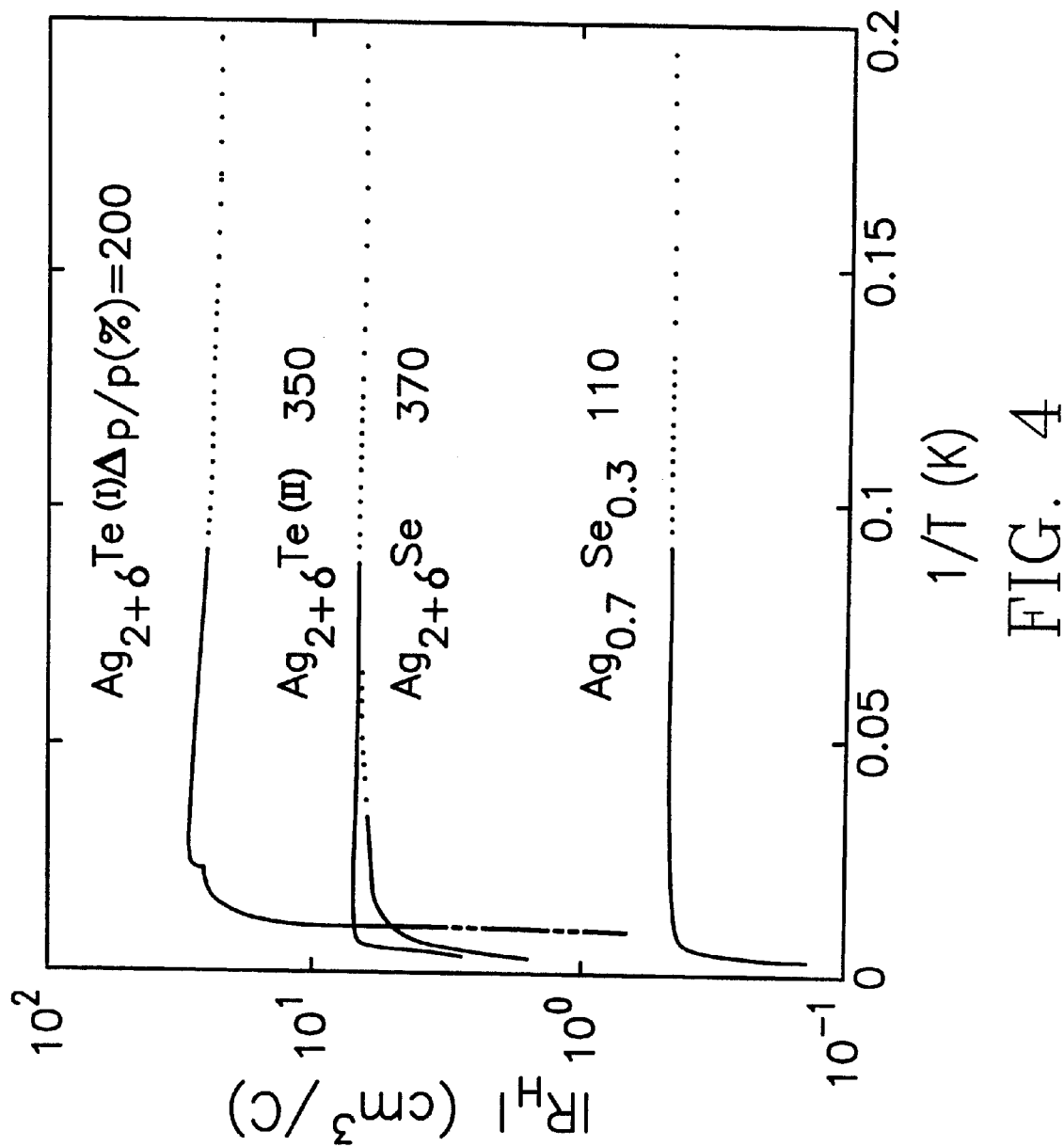
FIG. 4 shows graphically Hall coefficient $R_H$ (n-type) vs. inverse temperature for a set of silver chalcogenide samples, labeled by their magnetoresistive response (at T+4.5 K and H=55 kOe). Carrier density (which is proportional to $1/R_H$) in the intrinsic, low temperature limit appears to be a key causal parameter.

We have studied samples doped as far away from 2:1 stoichiometry as $Ag_{0.70}Se_{0.30}$, where $R_H(T\rightarrow 0)$ approaches 0.4 cm$^3$/C (n>$10^{19}$ cm$^{-3}$) and $\rho(T=300 K)=350 \mu\omega$-cm (FIG. 4). In this case, $\delta\rho/\rho$ falls to 110%, implying an optimal value for $\delta$ between 0.01 and 0.33. A significant advantage of the silver chalcogenides is that the Ag stoichiometry could be controlled precisely in future experiments through electrochemical techniques since silver β-alumina is readily available. The results of applying hydrostatic pressure also are encouraging. A pressure of only 7 kbar cut in half the room temperature resistivity of the $Ag_{2+\delta}Se$ sample of FIG. 2 without reducing the MR. By contrast, the MR in CMR compounds is severely suppressed by pressure. Hence, the strategy of introducing internal pressure through chemical means or, alternatively, interfacial stress in a silver chalcogenide thin film, may help satisfy the device goal of a small $\rho$ without sacrificing the large MR.

Methods: High purity $Ag_2Se$ and $Ag_2Te$ (5N) were used as received from Johnson Matthey Corporation and United Mineral Corporation. The stoichiometric materials were ground and loaded into four outgassed fused silica ampoules inside a helium glovebox and appropriate amounts of silver or selenium added to reach the desired compositions. The selenium was treated to remove the oxide coatings by filtering through a fine size frit near the melting point. The samples were sealed under vacuum, heated in a rocking furnace above their respective melting points for 24 hrs., and left to cool in a horizontal position. Powder x-ray diffraction gave the expected orthorhombic structure at room temperature with a grain size of at least 500 nm. No additional phases were detected in any sample. SQUID magnetometry on $Ag_{2+\delta}Se$ showed no evidence for paramagnetic impurities with an essentially temperature independent diamagnetic response, $\chi(T=4.5 K) = -1.7 \times 10^{-7}$ cm$^{-3}$.

This invention further contemplates altering the stoichiometry of narrow gap semiconductors for substantially changing the electrical resistance of these types of materials in the presence of a magnetic field. Narrow gap semiconductors capable of changed electrical resistance in a magnetic field include InTe, CdTe, HgTe, PbTe, SbTe, InSe, CdSe, HgSe, PbSc and SbSe. These compositional modulated narrow gap semiconductors have the general formula $B1+\delta Y$, where B=In,Cd,Hg,Pb or Sb, or a mixture thereof; Y=nTe or Se, or a mixture thereof; and $0.01<\delta<0.33$.

Figure 5:
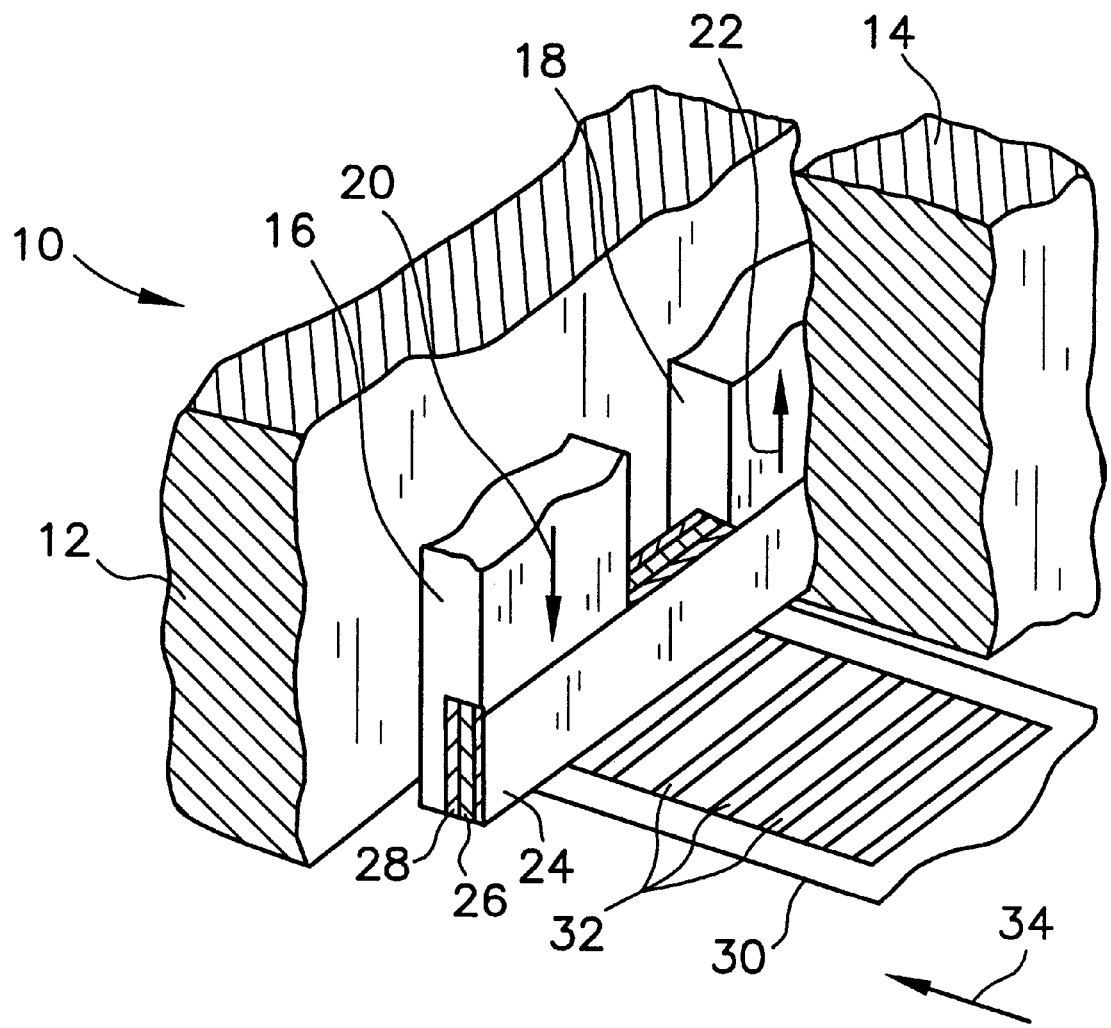
FIG. 5 is a simplified partial perspective view of a shielded magnetoresistive sensor incorporating a silver chalcogenide material in accordance with the present invention.

Referring to FIG. 5, there is shown a partially cut-away, simplified perspective view of an MR sensor 10 incorporating heavily-doped silver chalcogenides such as $Ag_{2+\delta}Se$ and $Ag_{2+\delta}Te$ in accordance with another aspect of the present invention. MR sensor 10 includes first and second magnetic shields 12 and 14. Disposed between the first and second magnetic shields 12,14 is the combination of first and second electrodes 16 and 18 and a thin MR film 24 comprised of the heavily-doped silver chalcogenides of the present invention. A magnetized soft adjacent layer (SAL) film 28 is disposed adjacent to the MR film 24 and the first and second electrodes 16,18. A spacer 26 is disposed intermediate between the soft adjacent layer film 28 and the MR film 24. A sense electric current is directed through the first and second electrodes 16,18 in the direction of arrows 20 and 22 for producing a magnetic field which saturates the soft adjacent layer film 28. The magnetized soft adjacent layer film 28, in turn, provides a magnetic field for biasing the MR film 24. The movement of a recording medium 30 having a plurality of magnetized elements 32 along the length thereof adjacent to the MR film 24 gives rise to a change in the resistance of the MR film which is detected by suitable detection circuitry (not shown for simplicity). The spaced magnetized elements 32 on the recording medium 30 represent information or data stored on the medium. It is in this manner that the magnetically recorded data on the recording medium 30 is detected by a MR film 24 comprised of heavily-doped silver chalcogenides $Ag_{2+\delta}Se$ and $Ag_{2+\delta}Te$ in accordance with the present invention.

There has thus been shown non-magnetic, heavily-doped silver chalcogenides such as $Ag_{2+\delta}Se$ and $Ag_{2+\delta}Te$ which exhibit magnetoresistance effects in the presence of a magnetic field which make these materials particularly adapted for use in magnetic recording devices. The inventive silver chalcogenides possess magnetoresistance characteristics on the scale of those of "colossal" magnetoresistance (CMR) compounds. Elements of narrow-gap semiconductor physics apply in these silver chalcogenides as established by Hall coefficient, magnetoconductivity, and hydrostatic pressure experiments. The size of these magnetoresistance effects at room temperature and the linear field dependence of the magnetoresistance down to very low magnetic fields of only a few Oersteds make the inventive chalcogenides particularly adapted for use in current types of data recording devices.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawing is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. A sensor device for detecting information recorded on a moving medium, wherein said information is recorded in the form of magnetized portions of said medium, said sensor device comprising:

magnetic shields;

an electrical conductor carrying a current and providing a magnetic field; and a magnetoresistance sensor disposed between said magnetic shields and adjacent said electrical conductor and said moving medium, wherein said magnetoresistance sensor is biased by said magnetic field and is responsive to the magnetized portions of said medium for providing an output representing the recorded information, wherein said magnetoresistance sensor is comprised of a doped silver chalcogenide having the composition:

$$A_{2+\delta}X$$

where

A=Ag or Cu, or a mixture thereof;
X=Se or Te, or a mixture thereof; and
$0.01<\delta<0.33$.

2. The sensor device of claim 1 wherein said magnetoresistance sensor includes internal stress producing means for reducing the electrical resistance therein.

3. The sensor device of claim 2 wherein said stress producing means is a chemical added to said chalcogenide.

4. The sensor device of claim 2 wherein said stress producing means is interfacial stress.

5. The sensor device of claim 1 wherein said magnetoresistance sensor is in the form of a thin film.

6. The sensor device of claim 5 wherein said electrical conductor is in the form of a magnetized soft adjacent layer film.

7. The sensor device of claim 6 further comprising a spacer disposed intermediate said magnetized soft adjacent layer film and said magnetoresistance sensor.

* * * * *